(12) United States Patent
Marotta (10) Patent No.: US 6,751,121 B2
(45) Date of Patent: Jun. 15, 2004

(54) FLASH MEMORY ARRAY ARCHITECTURE (75) Inventor: Giulio Giuseppe Marotta, Contigliano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/228,824

(22) Filed: Aug. 27, 2002

(65) Prior Publication Data

US 2003/0053348 A1 Mar. 20, 2003

(30) Foreign Application Priority Data

Aug. 29, 2001 (IT) .................................... RM2001A0516

(51) Int. Cl.$^7$ .............................................. G11C 16/06
(52) U.S. Cl. ............................. 365/185.09; 365/185.11; 365/189.05
(58) Field of Search ....................... 365/185.09, 185.11, 365/185.05, 200

(56) References Cited

U.S. PATENT DOCUMENTS

| 5,150,330 | A | * | 9/1992 | Hag ....................... 365/230.03 |
|---|---|---|---|---|
| 5,241,496 | A | | 8/1993 | Lowrey et al. |
| 5,892,703 | A | | 4/1999 | Raad |
| 6,005,813 | A | | 12/1999 | Waller |
| 6,081,447 | A | * | 6/2000 | Lofgren et al. ........ 365/185.09 |
| 6,141,286 | A | | 10/2000 | Vo |
| 6,310,805 | B1 | * | 10/2001 | Kasa et al. .................. 365/200 |
| 6,356,474 | B1 | | 3/2002 | Bissey |
| 6,587,383 | B1 | | 7/2003 | Roohparvar |
| 6,594,183 | B1 | * | 7/2003 | Lofgren et al. ........ 365/185.09 |
| 2003/0012045 | A1 | | 1/2003 | Brown |
| 2003/0031052 | A1 | | 2/2003 | Roohparvar |
| 2003/0058689 | A1 | | 3/2003 | Marotta |

* cited by examiner

*Primary Examiner*—Huan Hoang
(74) *Attorney, Agent, or Firm*—Leffert Jay & Polglaze, P.A.

(57) ABSTRACT

A flash memory array architecture. In one embodiment, a flash memory device comprises a first and second bank. Each bank has a pair of quadrants of memory cells. Each quadrant has a redundant fuse circuit to store operating parameters. Moreover, each redundant fuse circuit is coupled within an associated quadrant to reduce routing of signal lines. Each quadrant further has a sense amplifier circuit to read the memory cells.

44 Claims, 5 Drawing Sheets

FLASH MEMORY ARRAY ARCHITECTURE

RELATED APPLICATIONS

This application claims priority to Italian Patent Application Serial No. RM2001A000516, filed Aug. 29, 2001, entitled "FLASH MEMORY ARRAY ARCHITECTURE," and which is incorporated herein by reference.

TECHNICAL FIELD OF THE INVENTION

The present invention relates generally to non-volatile memory devices and in particular the present invention relates to flash memory array architecture.

BACKGROUND OF THE INVENTION

A flash memory is a type of non-volatile memory. That is, a flash memory is a type of memory that retains stored data without a periodic refresh of electricity. An important feature of a flash memory is that it can be erased in blocks instead of one byte at a time. Each erasable block of memory comprises a plurality of non-volatile memory cells (cells) arranged in rows and columns. Each cell is coupled to a word line, bit line and source line. In particular, a word line is coupled to a control gate of each cell in a row, a bit line is coupled to a drain of each cell in a column and the source line is coupled to a source of each cell in an erasable block. The cells are programmed and erased by manipulating the voltages on the word lines, bit lines and source lines.

Typically, flash memory integrated circuits include a primary or main array comprising a plurality of blocks of cells for storing external data and a secondary array of cells used to store operating parameters needed for operation of the flash memory. The types of data stored in the secondary array can include configuration bits to set the memory in a desired state at start up, engineering bits to store testing and manufacturing data, one time programmable (OTP) bits to store security and other customer data, trimming bits for the many analog functions of the memory, redundant bits to store memory addresses of defective rows and columns as well as redundancy columns and rows.

Traditionally, the secondary array is positioned along side the primary arrays in the integrated circuit in order to avoid discontinuities in the primary array. However, this type of architecture is quite cumbersome and requires the routing of many signal lines between the primary and secondary arrays. Moreover, interconnections in this architecture tend to waste a significant amount of silicon area as well as affect the overall speed of signals.

For the reasons stated above, and for other reasons stated below which will become apparent to those skilled in the art upon reading and understanding the present specification, there is a need in the art for a flash memory architecture that reduces the size of the flash memory without impacting the speed of the flash memory.

SUMMARY OF THE INVENTION

The above-mentioned problems with memory devices and other problems are addressed by the present invention and will be understood by reading and studying the following specification.

In one embodiment, a flash memory device is disclosed that includes a first and second bank. Each bank has a pair of quadrants of memory cells. Each quadrant further has a redundant fuse circuit to store operating parameters. Each redundant fuse circuit is coupled within an associated quadrant to reduce routing of signal lines. In addition, each quadrant has a sense amplifier circuit to read the memory cells.

In another embodiment, a non-volatile memory device comprises a memory array, a plurality of sense amplifiers, a plurality of data path circuitry and control circuitry. The memory array has two banks. Each bank has two quadrants of non-volatile memory cells. Moreover, each quadrant includes a plurality of non-volatile redundant fuses. There is a sense amplifier circuit for each quadrant of the memory array. The sense amplifier circuits are used to read the flash memory cells and the plurality of redundant fuses in each quadrant. Each of the data path circuitry is coupled to route data to and from each quadrant. The control circuitry is used to control memory operations to the memory array.

In another embodiment, a flash memory device comprises a first bank, a second bank and control circuitry. The first bank has a pair of quadrants of flash memory cells separated by a first row decoder circuit. The first row decode circuit is coupled to decode row address requests in the quadrants of the first bank. The second bank has a pair of quadrants of flash memory cells separated by a second row decoder circuit. The second row decoder circuit is coupled to decode row address requests in the quadrants of the second bank. Each quadrant is separated into individually erasable blocks of flash memory cells. Also included is a redundant fuse circuit for each quadrant. The redundant fuse circuit has a plurality of non-volatile redundant fuses that are used to store operating parameters that are used to operate an associated quadrant. A sense amplifier circuit is further included for each quadrant. Each sense amplifier circuit is coupled to read flash memory cells and non-volatile redundant fuses in the quadrants. In addition, there is a data path circuit for each quadrant to provide a data path to and from each quadrant. The control circuitry is used to control memory operations to the flash memory cells in the quadrants and the redundant fuses.

In another embodiment, a flash memory system comprises a memory array, a first and second row decoder, redundancy fuse circuits, sense amplifier circuits, data path circuitry, control circuitry and a processor. The memory array includes a first bank having a pair of quadrants of flash memory cells arranged in row and column fashion and a second bank having a pair of quadrants of flash memory cells arranged in row and column fashion. The first row decoder circuit is coupled to decode row address requests to the pair of quadrants in the first bank. The second row decoder circuit is coupled to decode row address requests to the pair of quadrants in the second bank. Each quadrant has a redundancy fuse circuit to store operating parameters. Moreover, each redundancy circuit is coupled within its associated quadrant to reduce routing of signals. A sense amplifier circuit is used for each quadrant. Each sense amplifier is coupled to read memory cells in its associated quadrant. A data path circuitry is used for each quadrant. The data path circuitry is used to transfer data to and from its associated quadrant. The control circuitry is used to control memory operations to the memory cells. The processor is coupled to provide external commands to the control circuitry and to receive and provide data to the data path circuitry.

A method of forming a flash memory comprising, separating a flash memory array into two banks of memory cells so the memory array can run two different memory operations concurrently, embedding redundant rows and redundant columns into each bank of the memory cells, embedding redundant fuse circuits to store operating parameters in the banks of memory cells to reduce the routing of signals and coupling sense amplifiers to the memory cells in the memory array and fuses in the redundant fuse circuit to read the memory cells and the operating parameters.

A method of operating a flash memory comprising, coupling regular columns of memory cells in a memory array into groups, wherein the columns within each group are selectively coupled to an associated sense amplifier, coupling redundant columns of memory cells embedded in the memory array into a redundant group, wherein the redundant columns in the redundant group are selectively coupled to a redundant sense amplifier and coupling an output of the redundant sense amplifier to a data path circuit to replace the output of a sense amplifier when an address request is to a defective column coupled to the sense amplifier.

DETAILED DESCRIPTION OF THE INVENTION

In the following detailed description of present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and the equivalents thereof.

Figure 1:
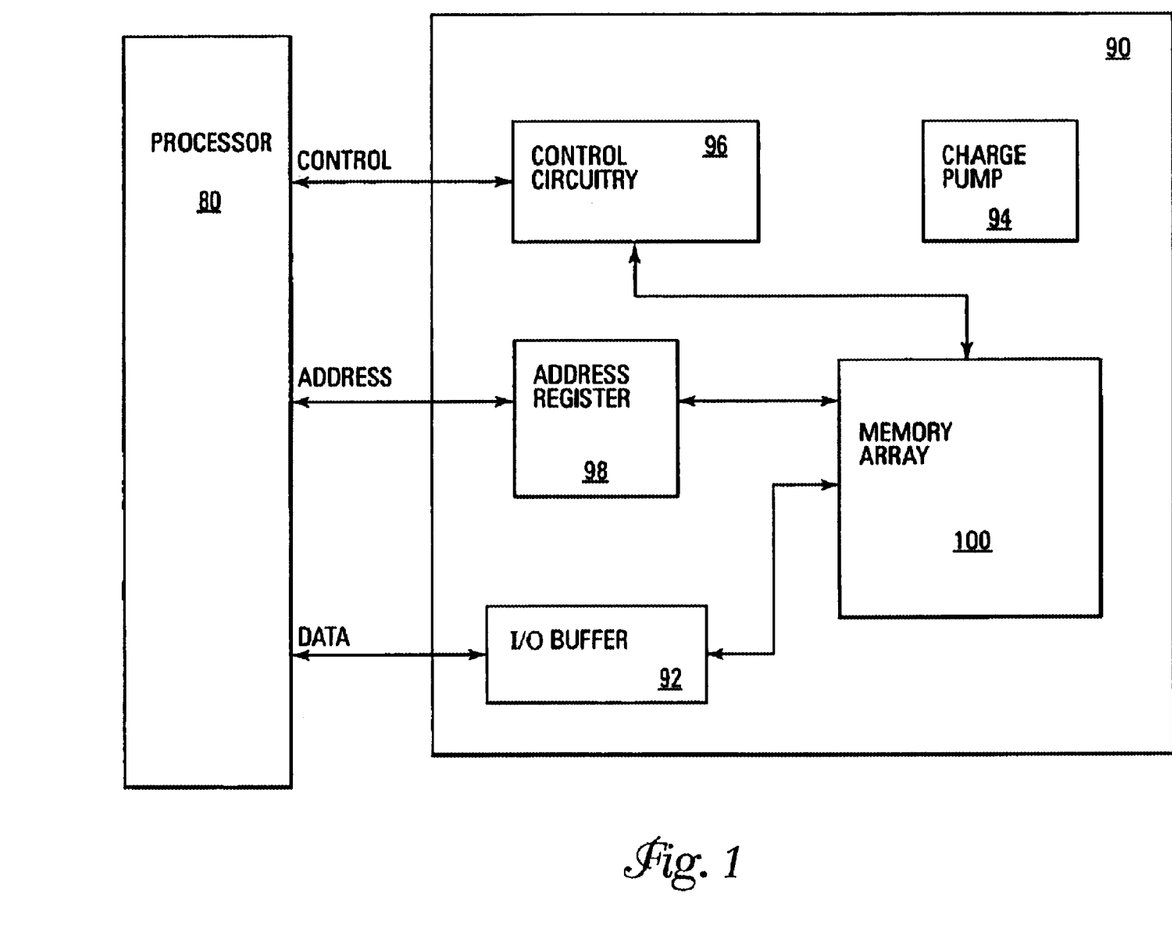
FIG. 1 is a block diagram of one embodiment of the present invention.

In the present invention, a novel architecture for a flash memory array is disclosed. A simplified block diagram of an integrated circuit flash memory device 90 is shown in FIG. 1. As shown, the flash memory device 90 has control circuitry 96 that is used to control memory operations to a memory array 100. These memory operations include read, write and erase operations. The control circuitry 96 may also be referred to as a state machine 96. The flash memory device 90 is also shown having a charge pump 94. The charge pump is used to increase voltage levels for use on memory cells during write and erase operations. An address register 98 is provided to receive address request to the memory array 100. In addition, an I/O buffer 92 is coupled to the memory array 100 to smooth out the flow of data to and from the flash memory array 100. As illustrated in FIG. 1, an external processor 80 is coupled to the flash memory device 90 to provide control signals to the state machine 96, to provide address requests to the address register 98 and to provide and receive data from the I/O buffer 92.

Figure 2:
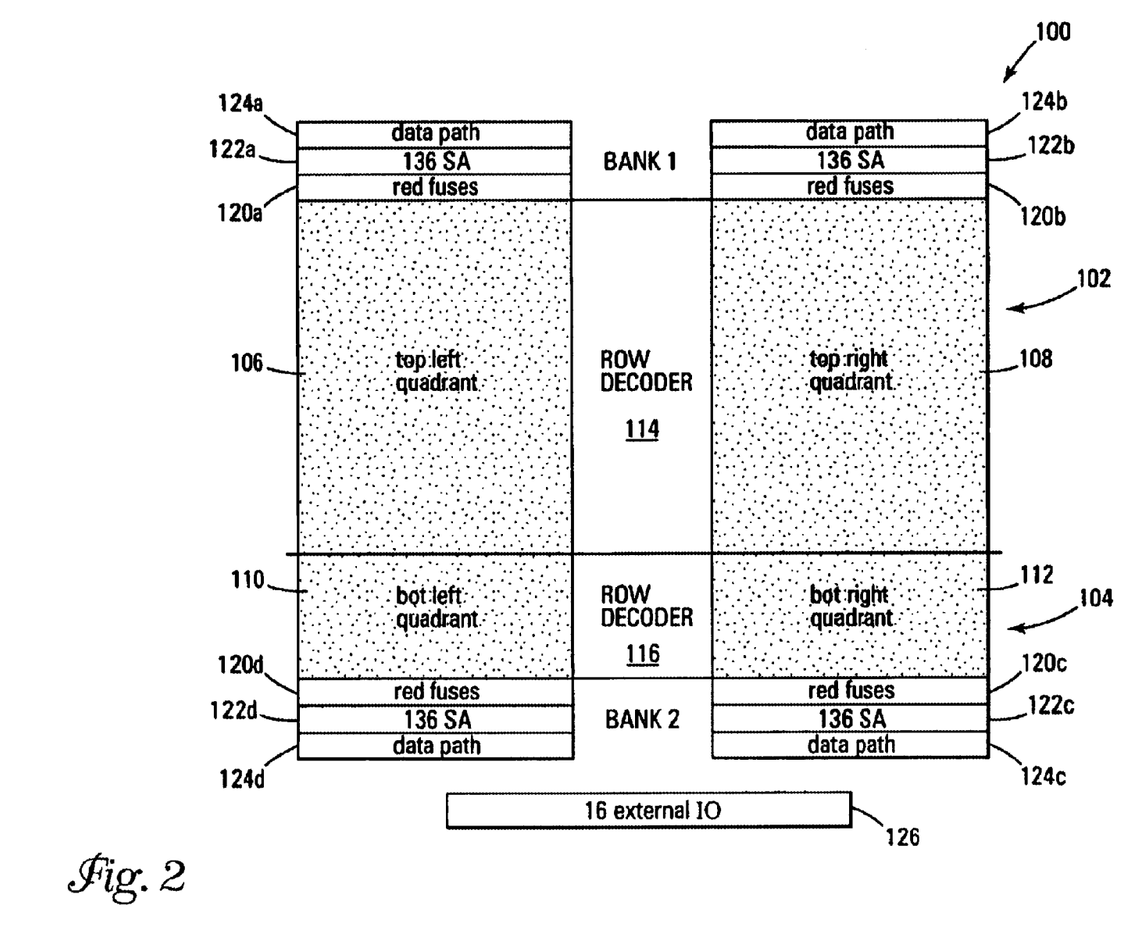
FIG. 2 is a block diagram of one embodiment of the flash memory of the present invention.

Referring to FIG. 2, one embodiment of a flash memory array 100 of the present invention is shown. As shown, the memory array 100 has a first bank 102 and a second bank 104. The first bank 102 is physically disconnected from the second bank 104. The duel banks 102 and 104 allow concurrent operations to take place in the memory array 100. For example, the first bank 102 can be performing a write operation and the second bank 104 can be performing a read operation.

Each bank 120 and 104 is divided into quadrants that make up the primary array. Specifically, the first bank 102 is divided into a top left quadrant 106 and a top right quadrant 108. The second bank 104 is divided into a bottom left quadrant 110 and a bottom right quadrant 112. The top left quadrant 106 and the top right quadrant 108 of the first bank 102 are separated by a first row decoder 114 (row decoder circuit 114). The first row decoder 114 is used to decode row address requests within the first bank 102. The bottom left quadrant 110 and the bottom right quadrant 112 of the second bank 104 are separated by a second row decoder 116 (second row decoder circuit 116). The second row decoder 116 is used to decode row address requests within the second bank 104. As illustrated in FIG. 2, the size of the top left and right quadrants 106 and 108 can be made a different size than the bottom left and right quadrants 110 and 112.

Each bank 102 and 104 has its own redundancy fuse circuit. The redundancy fuse circuits comprise redundancy fuses (non-volatile cells). In particular, the top left quadrant 106 of the first bank 102 is coupled to redundancy fuse circuit 120a and the top right quadrant 108 of the first bank 102 is couple to redundancy fuse circuit 120b. Moreover, the bottom left quadrant 110 of the second bank 104 is coupled to redundancy fuse circuit 120d and the bottom right quadrant 112 of the second bank 104 is coupled to redundancy fuse circuit 120c. The redundancy fuses in the redundancy fuse circuits 120(a–d) make up a secondary array to store operating parameters such as configuration bits, engineering bits, one time programmable (OTP) bits and trimming bits. Also included in the redundancy fuse circuits 120(a–d) are column and row redundancy fuses and latches used to selectively replace defective rows and columns with redundant rows and columns.

Each bank 102 and 104 has a sense amplifier circuit comprising sense amplifiers. In particular, the top left quadrant 106 of the first bank 102 is coupled to sense amplifier circuit 122a and the top right quadrant 108 of the first bank 102 is couple to sense amplifier circuit 122b. Moreover, the bottom left quadrant 110 of the second bank 104 is coupled to sense amplifier circuit 122d and the bottom right quadrant 112 of the second bank 104 is coupled to sense amplifier circuit 122c. The sense amplifiers in the sense amplifier circuits 122(a–c) are respectfully coupled to read the redundant fuses 120(a–d) and cells in respective quadrants 106, 108, 110 and 112.

Moreover, each bank 102 and 104 also has data path circuitry that is used to transfer data to and from the cells in the quadrants 106, 108, 110 and 112. In particular, the top left quadrant 106 of the first bank 102 is coupled to data path circuitry 124a and the top right quadrant 108 of the first bank 102 is couple to data path circuitry 124b. Moreover, the bottom left quadrant 110 of the second bank 104 is coupled to data path circuitry 124d and the bottom right quadrant 112 of the second bank 104 is coupled to data path circuitry 124c. The data path circuitry 124(a–d) is used to route data (bits) to and from the primary and secondary array.

Each data path circuitry 124(a–d) is coupled to external input/output (I/O) lines 126. The flash memory array 100 of FIG. 1 is illustrated as having 16 external I/O lines 126. In this example, 16 bits are read from or written to memory banks 102 and 104. It will, however, be recognized in the art that memory designs having more or less I/O lines could be used without departing from the spirit of the present invention and the present invention is not limited to 16. In addition, the terms "top," "bottom," "left" and "right" are used merely to define the four separate quadrants 106, 108, 110 and 112. That is, the terms are merely used to aid the reader in understanding location of each quadrant with respect to the other quadrants regardless of the orientation of an integrated circuit incorporating a flash memory of the present invention.

Figure 3:
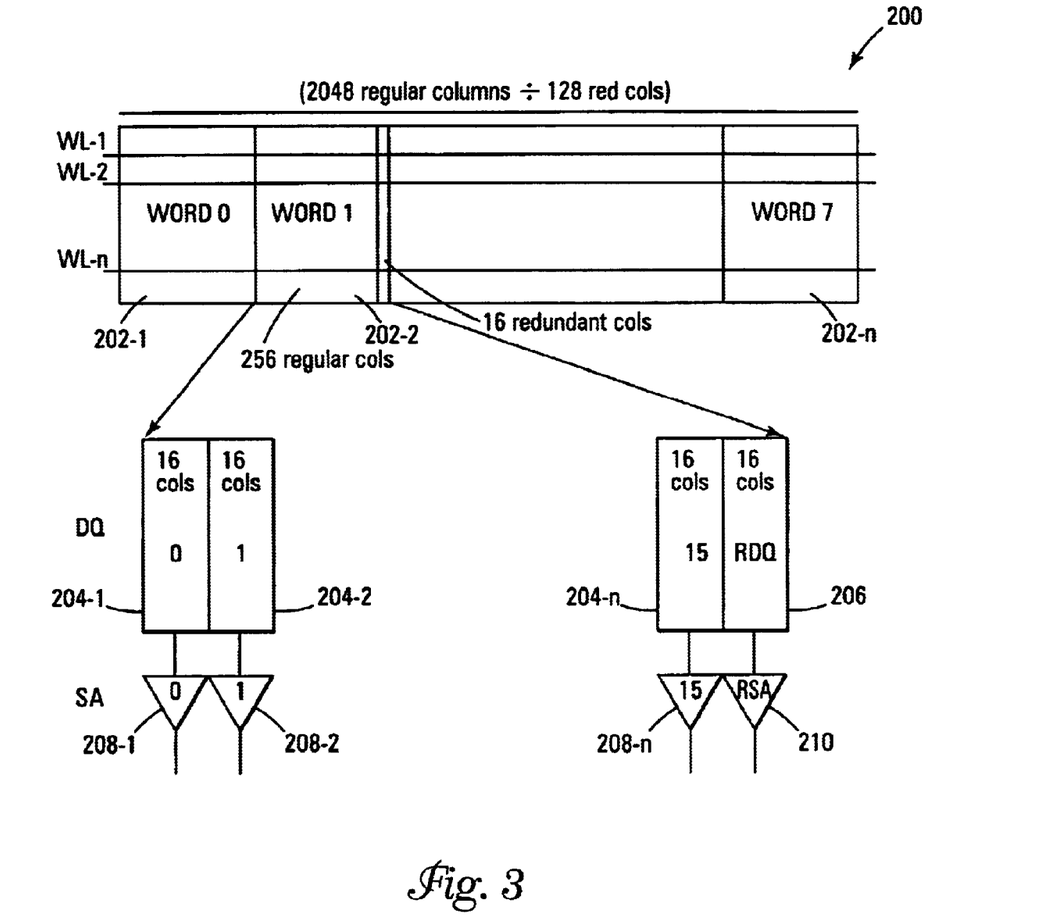
FIG. 3 is a block diagram of one embodiment of the present invention, illustrating the contents of an erasable sector of flash memory cells.

Each of the quadrants 106, 108, 110 and 112 are partitioned into individually erasable sectors 200 or blocks 200. Referring to FIG. 3, the contents of a sector 200 of one embodiment of the present invention is illustrated. In this embodiment, sector 200 is illustrated as having 2048 regular columns and 128 redundant columns. As shown, sector 200 is made up of a group of words 202(l–n). Moreover, in this embodiment there are 8 groups of words 202(l–n). In addition, in this embodiment, the words 202(l–n) have 256 regular columns and 16 redundant columns. The columns in each sector 200 can also be referred to as local bit lines BL(l–n). As shown, word lines WL(l–n) transverse the words 202(l–n) and are coupled to control gates of memory cells arranged in rows. In addition, in this embodiment, the columns or bit lines in each word 202(l–n) are further grouped into 17 groups of 16 DQs groups 204(l–n) containing the regular columns and 1 RDQ group 206 containing the redundant columns. Each DQ group 204(l–n) contains 16 columns and each RDQ group 206 contains 16 redundant columns. Each DQ group 204(l–n) is coupled to an associated sense amplifier 208(l–n) and the RDQ 206 group is coupled to a redundant sense amplifier 210. In one embodiment, three bits of a memory address are used to select 1 out of the 8 words 202(l–n) and four bits (column address bits) are used to select 1 out of the 16 columns of each DQ 204(l–n) including the RDQ 206. In reading the memory, the selected column is coupled to its associated sense amplifier 208(l–n) or redundant sense amplifier 210.

Although, sector 200 of FIG. 3 is described as having 2048 regular columns and 128 redundant columns, it will be understood in the art that the number of columns and the number of redundant columns in each sector could vary, and the present invention is not limited to sectors having 2048 regular columns and 128 redundant columns. Likewise, it will also be understood in the art that the number of columns in each word 202(l–n) could very without departing from the sprit of the present invention.

Figure 4:
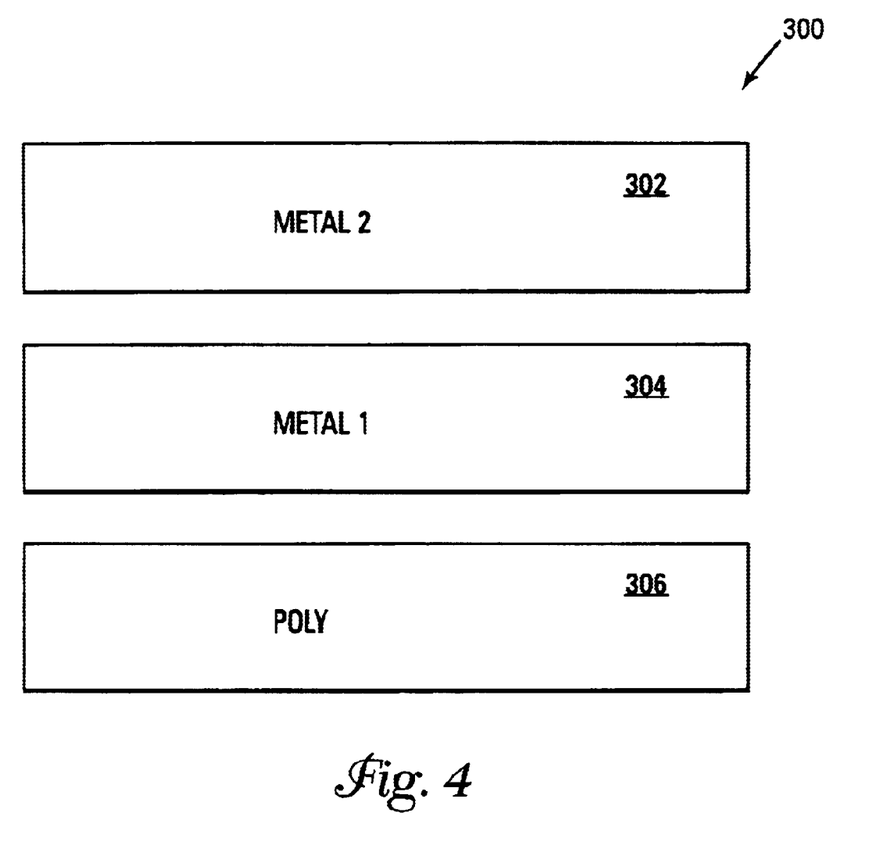
FIG. 4 is a block diagram illustrating the layers of material used to make one embodiment of the present invention.

Referring to FIG. 4, a physical layout 300 of the materials of the integrated circuit used to make one embodiment of the present invention is shown. In particular, FIG. 4 illustrates the physical positioning of material layers in relation to each other. For example, the word lines WL(l–n) are poly silicon lines formed in the poly silicon layer 306. The local bit lines BL(l–n) are formed in a first metal layer 304. All the local bit lines are merged into global bit lines. The global bit lines are formed in a second metal layer 302. In addition, lines going into and out of the quadrants 106, 108, 110 and 112 that are coupled to external input/output lines 126 are also formed in the second metal layer. The memory architecture as described above allows for additional structures relating to the secondary array to be made in the poly and firsts metal layers 306 and 304. The first and second metal layers 304 and 302 are made of conducting metals including, but not limited to, copper, aluminum, gold and silver.

In addition, by means of this arrangement, the architecture is very compact because all secondary arrays and their associate circuits are virtually embedded into the primary array. The secondary arrays are either made by additional columns (column redundancy) positioned inside the primary array or by redundant fuses 122(a–d) coupled as part of an associated quadrant 106, 108, 110 and 112. Moreover, in one embodiment efficiency is reached by limiting metal interconnections to only two layers, the first metal layer and the second metal layer, thereby avoiding the cost of using a third metal layer (not shown). In another embodiment, a third metal layer (not shown) is used for interconnections to increase the speed of the memory 100.

Figure 5:
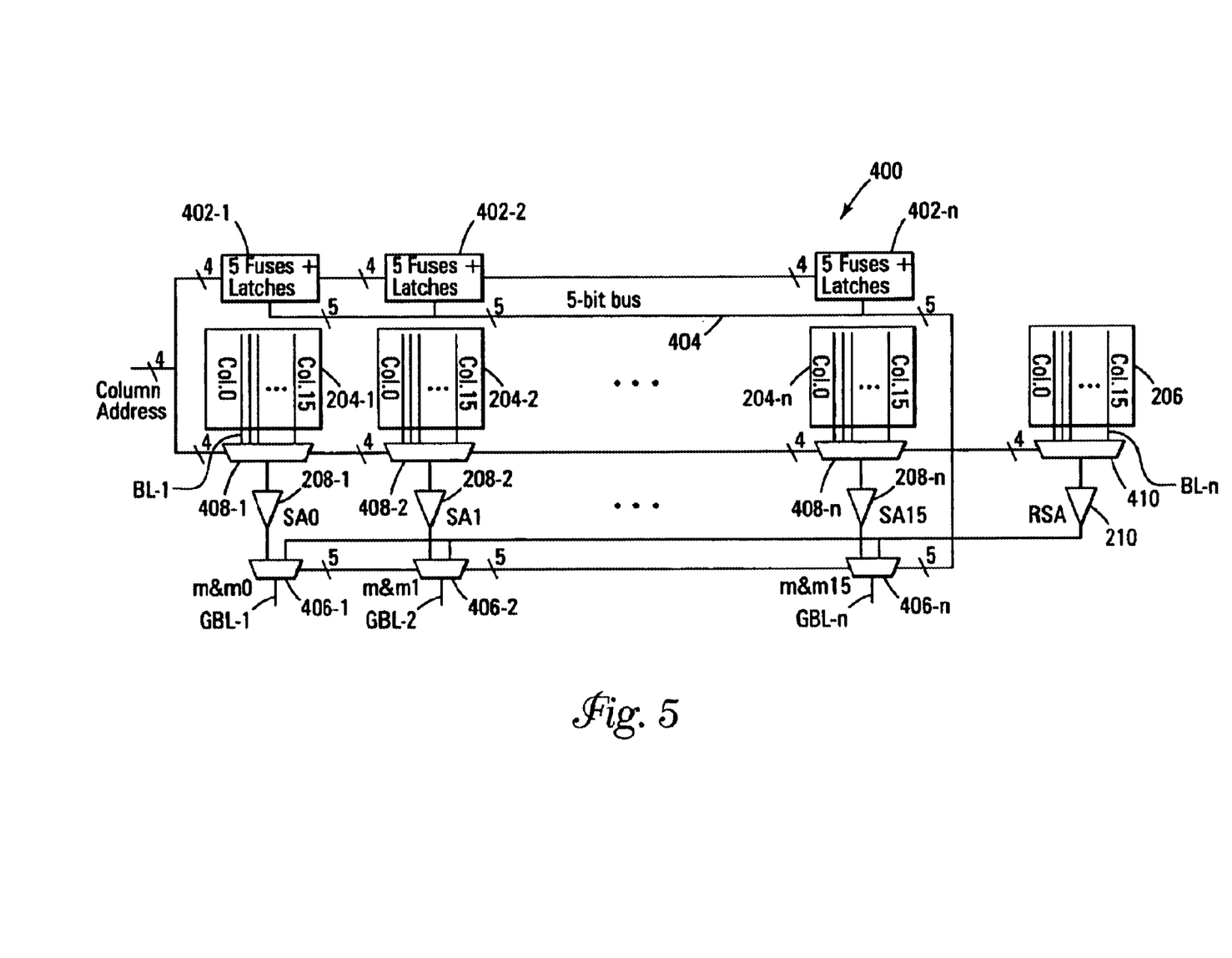
FIG. 5 is a block diagram of the column redundancy scheme in one embodiment of the present invention.

Referring to FIG. 5, a column redundancy circuit 400 of one embodiment of the present invention is illustrated. The column redundancy circuit 400 is used to implement the redundant columns embedded in the primary memory array. As shown, the column redundancy circuit 400 has fuse/latch circuits 402(l–n). Each fuse/latch circuits 402(l–n) is located in an associated redundancy fuse circuit (120(-d). In one embodiment, there are 16 fuse/latch circuits 402(l–n). Each fuse/latch circuit 402(l–n) is illustrated as having 5 fuses. FIG. 5 also illustrates multiplexers 408(l–n). Multiplexers 408(l–n) are used to selectively couple the columns in associated DQ 204(l–n) to associated sense amplifiers 208 (l–n). In one embodiment of the present invention, the multiplexers 408(l–n) are positioned between the sectors 200 that make a quadrant 106, 108, 110 or 112. Moreover, FIG. 5 also illustrates bit lines BL(l–n) and global bit lines GBL(l–n). Referring back to FIG. 4, the redundant multiplexer 410, that is used for selectively coupling the redundant columns in redundant DQ 206 to the redundant sense amplifier 210, is also illustrated.

After a memory is manufactured it is tested, the fuses in the fuse/latch circuits 402(l–n) are then programmed to replace failing columns. At power up of the memory, the fuses transfer their non-volatile information into associated latches in the fuse/latch circuits 402(l–n). One of the latches of the fuse/latch circuits 402(l–n) is selected by the same 4 column address bits used to select one of the 16 columns of a DQ 204(l–n). Moreover, one bit of the 5 bits in each fuse/latch circuit 402(l–n) is used to assert that a repair has been made and the other 4 bits are used to identify the DQ 240(l–n) in which the replacement has occurred.

For example, if column 14 of DQ 204-6 is defective and needs to be replaced by a redundant column, during the testing of the memory, the first fuse in the fuse/latch circuit 410-14 is programmed to store a 1 bit, while the binary number 6 (0110) is stored in the other 4 fuses. The redundancy column is also programmed to carry the correct bit. When the memory is powered up, the non-volatile fuses in the fuse/latch circuit 410-14 transfer their contents to the associated latches in the fuse/latch circuit 410-14. During operation, if a 4 bit column address selects column 14 the latches in fuse/latch circuit 410-14 are addressed. The 5 bits (1-0110) are then sent over the 5-bit bus 405 to the select inputs of 16 multiplexer matching circuits 406(l–n) or decoders 406(l–n). The first bit flags that a replacement must occur and enables the multiplexer/matching circuits 406 (l–n). The next four bits enable a specific multiplexer/matching circuit 406(l–n). In this example, the 4 bits 01010 enable multiplexer/matching circuit 406-6. Multiplexer/matching circuit 406-6 then replaces the output of the regular sense amplifier 208-6 with an output of the redundant sense amplifier 210.

In using the embodiment as described above, it is possible to repair 16 columns per word 204(l–n). This is sufficient for industry standard flash memory. Moreover, the scheme effectively repairs two adjacent columns in an array. Column to column shorts are a common defect in memory arrays. In the above example, if it is also determined during testing that column 13 of DQ 204-6 is defective (shorted to column 14 of DQ 204-6) the fuses in fuse/latch circuit 410-13 are also programmed with bits 1-0110. Thereafter, during read operations when the 4 bit column address points to column 13 of DQ 204-6, the information stored in the 5 latches in the fuse/latch circuit 410-13 is output to the 5 bit bus 404. This once again enables multiplexer/matching circuit 406-6 which now replaces the data in the defective column 13 in DQ 204-6 with data in column 13 of redundant DQ 206.

Conclusion

A flash memory array architecture is disclosed. In one embodiment, a flash memory device comprises a first and second bank. Each bank has a pair of quadrants of memory cells. Each quadrant has a redundant fuse circuit to store operating parameters. Moreover, each redundant fuse circuit is coupled within an associated quadrant to reduce routing of signal lines. Each quadrant further has a sense amplifier circuit to read the memory cells.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A flash memory device comprising:
   a first and second bank, each bank having a pair of quadrants of memory cells;
   each quadrant having a redundant fuse circuit to store operating parameters, wherein each redundant fuse circuit is coupled within an associated quadrant to reduce routing of signal lines; and
   each quadrant having a sense amplifier circuit to read the memory cells.

2. The flash memory device of claim 1 further comprising:
   a first row decoder circuit coupled between the pair of quadrants in the first bank to route row address requests to the memory cells in the pair of quadrants in the first bank; and
   a second row decoder circuit coupled between the pair of quadrants in the second bank to route row address requests to the memory cells in the pair of quadrants in the second bank.

3. The flash memory device of claim 1 further comprising control circuitry to control memory operations to the quadrants.

4. The flash memory of claim 1 wherein each quadrant further comprises:
   a plurality of individually erasable sectors of memory cells.

5. The flash memory of claim 4 wherein each sector is arranged in groups of words, further wherein each word contains a plurality of regular columns of memory cells and a plurality of redundant columns of memory cells.

6. The flash memory of claim 5 wherein the regular columns in each word are further separated into DQ groups and the redundant columns in each word are separated into a RDQ group.

7. The flash memory of claim 6 wherein each DQ group of word lines are selectively coupled to an associated sense amplifier in the sense amplifier circuit by a multiplexer and the redundant columns in the RDQ group are selectively coupled to a redundant sense amplifier in a redundant sense amplifier circuit by a multiplexer.

8. The flash memory device of claim 7 wherein the redundant fuse circuit further comprises:
   a plurality of fuse/latch circuits to store and latch addresses of defective columns.

9. The flash memory device of claim 8 further comprising:
   a data path circuit for each quadrant to transfer data to and from the memory cells in the quadrant; and
   a decoder for each sense amplifier in the sense amplifier circuit to selectively couple an output of the sense amplifiers to the data path circuit, each decoder is coupled to receive addresses of defective columns in DQ groups from the fuse/latch circuit, wherein a decoder provides an output from the redundant sense amplifier when a respective address of a defective column is received by the decoder.

10. A non-volatile memory device comprising:
    a memory array having two banks, each bank having two quadrants of non-volatile memory cells, where each quadrant further includes a plurality of non-volatile redundant fuses;
    a sense amplifier circuit for each quadrant of the memory array to read the flash memory cells and the plurality of redundant fuses in each quadrant;
    data path circuitry for each quadrant coupled to route data to and from each quadrant; and
    control circuitry to control memory operations to the memory array.

11. The non-volatile memory device of claim 10 wherein each quadrant comprises a plurality of erasable sectors of memory cells.

12. The non-volatile memory device of claim 11 wherein columns of memory cell in each erasable sector of memory cells are grouped into words, further wherein each word comprises a plurality of regular columns of memory cells and a plurality of redundant columns of memory cells.

13. The non-volatile memory device of claim 12 wherein each word comprises 256 regular columns and 16 redundant columns.

14. The non-volatile memory device of claim 12 wherein the regular columns of memory cells are further grouped in DQ groups and the plurality of redundant columns are grouped into a RDQ group.

15. The non-volatile memory device of claim 14 wherein each DQ group comprises 16 regular columns of memory cells and the RDQ group comprises 16 redundant columns of memory cells.

16. The non-volatile memory device of claim 14 wherein each DQ group in each word is coupled to an associated sense amplifier in the sense amplifier circuit of an associated quadrant.

17. The non-volatile memory device of claim 14 wherein the RDQ group is coupled to an associated redundant sense amplifier in the sense amplifier circuit of an associated quadrant.

18. A flash memory device comprising:
    a first bank having a pair of quadrants of flash memory cells separated by a first row decoder circuit, wherein the first row decode circuit is coupled to decode row address requests in the quadrants of the first bank;
    a second bank having a pair of quadrants of flash memory cells separated by a second row decoder circuit, wherein the second row decoder circuit is coupled to decode row address requests in the quadrants of the second bank;

each quadrant is separated into individually erasable blocks of flash memory cells;
a redundant fuse circuit for each quadrant, the redundant fuse circuit having a plurality of non-volatile redundant fuses to store operating parameters used to operate an associated quadrant;
a sense amplifier circuit for each quadrant coupled to read flash memory cells and non-volatile redundant fuses in the quadrants;
a data path circuit for each quadrant to provide a data path to and from each quadrant; and
control circuitry to control memory operations to the flash memory cells in the quadrants and the redundant fuses.

19. The flash memory device of claim 18 wherein the first bank is adjacent the second bank.

20. The flash memory device of claim 18 further comprising:
a plurality of word lines, each word line is coupled to control gates of memory cells arranged in a row;
a plurality of local bit lines coupled to drains of memory cells arranged in columns;
a plurality of global bit lines selectively coupled to the local bit lines; and
wherein the word lines are made of a poly silicon layer, the local bit lines are made in a first metal layer and the global bit lines are made in a second metal layer, further wherein the first metal layer is positioned between the second metal layer and poly silicon layer.

21. The flash memory device of claim 20 wherein metal interconnections are limited to only the first metal layer and the second metal layer to reduce cost.

22. The flash memory device of claim 20 wherein a third metal layer is used for interconnections to increase speed of the flash memory device.

23. The flash memory device of claim 18 wherein the flash memory cells in each block are arranged in column and row fashion, further wherein the columns in each block are further divided into words, each word containing a plurality of regular columns of memory cells and a plurality of redundant columns.

24. The flash memory device of claim 23 wherein the regular columns of memory cells in each word are further divided into DQ groups and the redundant columns in each word are grouped into a RQD group.

25. The flash memory device of claim 24 wherein the regular columns in each DQ group are selectively coupled to an associated sense amplifier in the sense amplifier circuit and the redundant columns in each RDQ group are selectively coupled to an associated redundant sense amplifier in the sense amplifier circuit.

26. The flash memory device of claim 25 further comprising:
a plurality of multiplexers to selectively couple the regular columns in the DQ groups and the redundant columns in a RDQ group to their respective sense amplifiers.

27. The flash memory device of claim 26 wherein the redundant fuse circuit further comprises:
column redundancy fuses; and
latches, wherein at power up information stored in the column redundancy fuses are transferred to their associated latches for use by the memory device.

28. The flash memory device of claim 27 further comprising:
a plurality of multiplexer matching circuits to selectively couple outputs of the sense amplifiers to the data path circuit, each multiplexer matching circuit having a first input coupled to an output of an associated sense amplifier coupled to an associated DQ group, each multiplexer matching circuit further having a second input coupled to an output of an associated redundant sense amplifier coupled to an associated RDQ group, the multiplexer matching circuit also having a select input coupled to an output of the latches in the redundancy fuse circuit to selectively activate the multiplexer matching circuit; and
wherein select multiplexer matching circuits replace the output of defective columns in DQ groups with the output of redundant columns in the RDQ group in response to a signal received by the select inputs of associated multiplexer matching circuits.

29. A flash memory system comprising;
a memory array, the memory array including,
a first bank having a pair of quadrants of flash memory cells arranged in row and column fashion, and
a second bank having a pair of quadrants of flash memory cells arranged in row and column fashion;
a first row decoder circuit coupled to decode row address requests to the pair of quadrants in the first bank;
a second row decoder circuit coupled to decode row address requests to the pair of quadrants in the second bank;
each quadrant having a redundancy fuse circuit to store operating parameters, wherein each redundancy circuit is coupled within its associated quadrant to reduce routing of signals;
a sense amplifier circuit for each quadrant coupled to read memory cells in its associated quadrant;
data path circuitry for each quadrant to transfer data to and from its associated quadrant;
control circuitry to control memory operations to the memory cells; and
a processor coupled to provide external commands to the control circuitry, the processor is further coupled to receive and provide data to the data path circuitry.

30. The flash memory system of claim 29 wherein the first row decoder is coupled between the pair of quadrants in the first bank and the second row decoder is coupled between the pair of quadrants in the second bank.

31. The flash memory system of claim 29 wherein the pair of quadrants in the first bank are a different size than the pair of quadrants in the second bank.

32. The flash memory system of claim 29 wherein the redundancy fuse circuit includes redundancy row fuses to store addresses of defective rows and redundancy column fuses to store addresses of defective columns.

33. The flash memory system of claim 32 wherein each quadrant has a plurality of redundant rows embedded therein, further wherein the addresses stored in the redundancy row fuses are used to redirect address requests from defective rows in an associated quadrant to redundant rows in the quadrant.

34. The flash memory system of claim 29 wherein each quadrant has a plurality of redundant columns embedded therein, further wherein the addresses stored in the redundancy column fuses are used to redirect address requests from defective columns in an associated quadrant to redundant columns in the quadrant.

35. A method of forming a flash memory comprising:
separating a flash memory array into two banks of memory cells so the memory array can run two different memory operations concurrently;

embedding redundant rows and redundant columns into each bank of the memory cells;

embedding redundant fuse circuits to store operating parameters in the banks of memory cells to reduce the routing of signals; and coupling sense amplifiers to the memory cells in the memory array and fuses in the redundant fuse circuit to read the memory cells and the operating parameters.

36. The method of claim 35 further comprising:

using a row decoder to separate each bank into two quadrants.

37. The method of claim 35 further comprising:

forming word lines coupled to control gates of the memory cells arranged in columns in a poly silicon layer;

forming local bits coupled to drains of the memory cells arranged in rows in a first metal layer;

forming global bit lines selectively coupled to the local bit lines in a second metal layer, wherein the first metal layer is positioned between the poly silicon layer and the second metal layer.

38. The method of claim 37 further comprising:

forming metal interconnections in the first metal layer and second metal layer.

39. The method of claim 37 further comprising:

forming interconnections in a third metal layer.

40. A method of operating a flash memory comprising:

coupling regular columns of memory cells in a memory array into groups, wherein the columns within each group are selectively coupled to an associated sense amplifier;

coupling redundant columns of memory cells embedded in the memory array into a redundant group, wherein the redundant columns in the redundant group are selectively coupled to a redundant sense amplifier;

coupling an output of the redundant sense amplifier to a data path circuit to replace the output of a sense amplifier when an address request is to a defective column coupled to the sense amplifier;

storing addresses of defective regular columns in redundant column fuses;

transferring the addresses in the redundant column fuses to associated latches at power up of the flash memory; and latching the addresses to multiplexer matching circuits coupled to associated outputs of the sense amplifiers to select between outputs of an associated sense amplifier or the redundant sense amplifier.

41. A method of claim 40 further comprising grouping the memory cells in the memory array into groups of 16 regular columns and groups of 16 redundant columns.

42. A method of claim 41 wherein each group of regular columns of memory cells is associated with a fuse/latch circuit, further wherin each fuse/latch circuit has 5 fuses to store 5 bits.

43. A method of claim 42 wherein the first bit flags that a replacement must occur and enables the multiplexer matching circuits that are coupled to selectively pass outputs of the sense amplifiers or redundant sense amplifiers, the four remaining bits enable a specific multiplexer matching circuit associated with a sense amplifier that is coupled to a defective column to be replaced.

44. A method of claim 43 wherein the specific multiplexer matching circuit selectively couples the output of the redundant sense amplifiers to the data path circuit instead of an output of the sense amplifier coupled to a defective column.

* * * * *

UNITED STATES PATENT AND TRADEMARK OFFICE
CERTIFICATE OF CORRECTION

PATENT NO. : 6,751,121 B2
DATED : June 15, 2004
INVENTOR(S) : Marotta

It is certified that error appears in the above-identified patent and that said Letters Patent is hereby corrected as shown below:

Column 12,
Lines 16, 20, 24 and 31, remove "A" and insert -- The --
Line 22, remove "wherin" and insert -- wherein --

Signed and Sealed this

Fourteenth Day of December, 2004

JON W. DUDAS
*Director of the United States Patent and Trademark Office*